(12) United States Patent
Kuo et al.

(10) Patent No.: US 11,063,091 B2
(45) Date of Patent: Jul. 13, 2021

(54) DISPLAY PANEL

(71) Applicant: Au Optronics Corporation, Hsinchu (TW)

(72) Inventors: Ya-Pei Kuo, Hsinchu (TW); Peng-Yu Chen, Hsinchu (TW); Hong-Shiung Chen, Hsinchu (TW); Cheng-Chih Hsieh, Hsinchu (TW); Xuan-Chen Ye, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/413,617

(22) Filed: May 16, 2019

(65) Prior Publication Data

US 2020/0052045 A1    Feb. 13, 2020

Related U.S. Application Data

(60) Provisional application No. 62/717,036, filed on Aug. 10, 2018.

(30) Foreign Application Priority Data

Jan. 4, 2019   (TW) ............................. 108100320

(51) Int. Cl.
*G09G 3/30* (2006.01)
*G09G 3/20* (2006.01)
*H01L 27/32* (2006.01)
*G09G 3/3225* (2016.01)

(52) U.S. Cl.
CPC ........ *H01L 27/3211* (2013.01); *G09G 3/2003* (2013.01); *G09G 3/3225* (2013.01)

(58) Field of Classification Search
CPC .......................... G02F 1/1368; G02F 1/134309
See application file for complete search history.

(56) References Cited

U.S. PATENT DOCUMENTS

| | | | |
|---|---|---|---|
| 2004/0263670 A1 | 12/2004 | Yamasaki | |
| 2007/0146247 A1* | 6/2007 | Huang | G09G 3/3233 345/76 |
| 2014/0111115 A1* | 4/2014 | Bai | G02F 1/134309 315/312 |
| 2014/0133046 A1* | 5/2014 | Sung | G02F 1/1335 359/893 |
| 2015/0124199 A1* | 5/2015 | Su | G02F 1/133603 349/69 |
| 2017/0123453 A1 | 5/2017 | Evans et al. | |
| 2017/0294492 A1* | 10/2017 | Lv | H01L 27/3218 |
| 2019/0025655 A1* | 1/2019 | Kim | G02F 1/133617 |

FOREIGN PATENT DOCUMENTS

| | | |
|---|---|---|
| CN | 207264695 | 4/2018 |
| CN | 108269502 | 7/2018 |

* cited by examiner

*Primary Examiner* — Nan-Ying Yang
(74) *Attorney, Agent, or Firm* — JCIPRNET

(57) ABSTRACT

A display panel including a substrate, a plurality of first pixels and a plurality of second pixels is provided. The substrate has a first display region and a second display region. The first pixels are disposed on the first display region. The second pixels are disposed on the second display region. The ratio of the transmittance of the second pixels to the transmittance of the first pixels is 0.33 to 0.66.

14 Claims, 5 Drawing Sheets

DISPLAY PANEL

CROSS-REFERENCE TO RELATED APPLICATION

This application claims the priority benefits of U.S. provisional application Ser. No. 62/717,036, filed on Aug. 10, 2018, and Taiwan application serial no. 108100320, filed on Jan. 4, 2019. The entirety of each of the above-mentioned patent applications is hereby incorporated by reference herein and made a part of this specification.

BACKGROUND

Technical Field

The present invention relates to a display panel, and more particularly to a display panel including two types of pixels.

Description of Related Art

Currently, in order to increase the ease of use of products, many manufacturers combine display devices with cameras. For example, camera functions are often included in existing mobile phones or tablets. In an existing mobile phone or tablet, in order to provide a sufficient border region to set the front lens, the area of the display region is often limited. Specifically, the display panel is often drilled in the border region to set the lens of the camera. However, since the portion of the drilled hole does not have the display function, the area of the display region of the display device which can display images is limited.

SUMMARY

The invention provides a display panel, which can increase the area of the region where the display panel can display images.

At least one embodiment of the present invention provides a display panel including a substrate, a plurality of first pixels, and a plurality of second pixels. The substrate has a first display region and a second display region. The first pixels are located on the first display region. The second pixels are located on the second display region. The ratio of the transmittance of the second pixels to the transmittance of the first pixels is 0.33 to 0.66.

The above described features and advantages of the present invention will be more apparent from the following description.

DESCRIPTION OF THE EMBODIMENTS

Figure 1A:
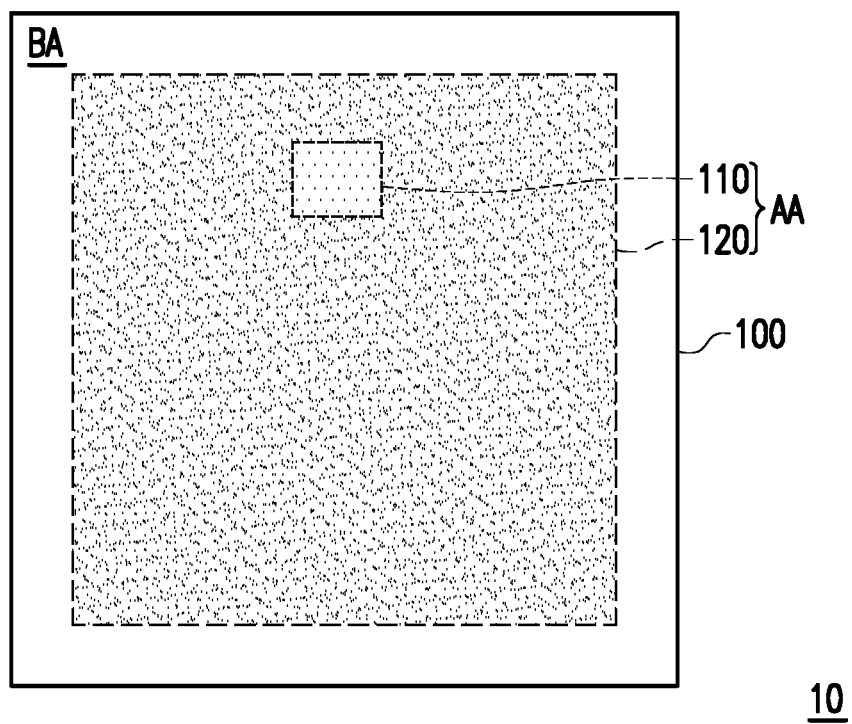
FIG. 1A is a schematic top view of a display panel according to an embodiment of the present invention.

FIG. 1A is a schematic top view of a display panel according to an embodiment of the present invention.

Referring to FIG. 1A, a substrate 100 of a display panel 10 has a display region AA, and the display region AA has a first display region 110 and a second display region 120. In the embodiment of FIG. 1A, the second display region 120 is located outside the first display region 110, but the invention is not limited thereto, and the relative positional relationship of the first display region 110 and the second display region 120 is adjusted according to different design or product requirements. For example, in the embodiment, the second display region 120 surrounds the first display region 110. In another embodiment, the first display region 110 is located at one side or one corner of the second display region 120. In the embodiment, the substrate 100 further includes a peripheral region BA located on at least one side of the display region AA, and the peripheral region BA is used to set the driving circuit, but the invention is not limited thereto. In other embodiments, the substrate 100 does not include the peripheral region BA.

Figure 1B:
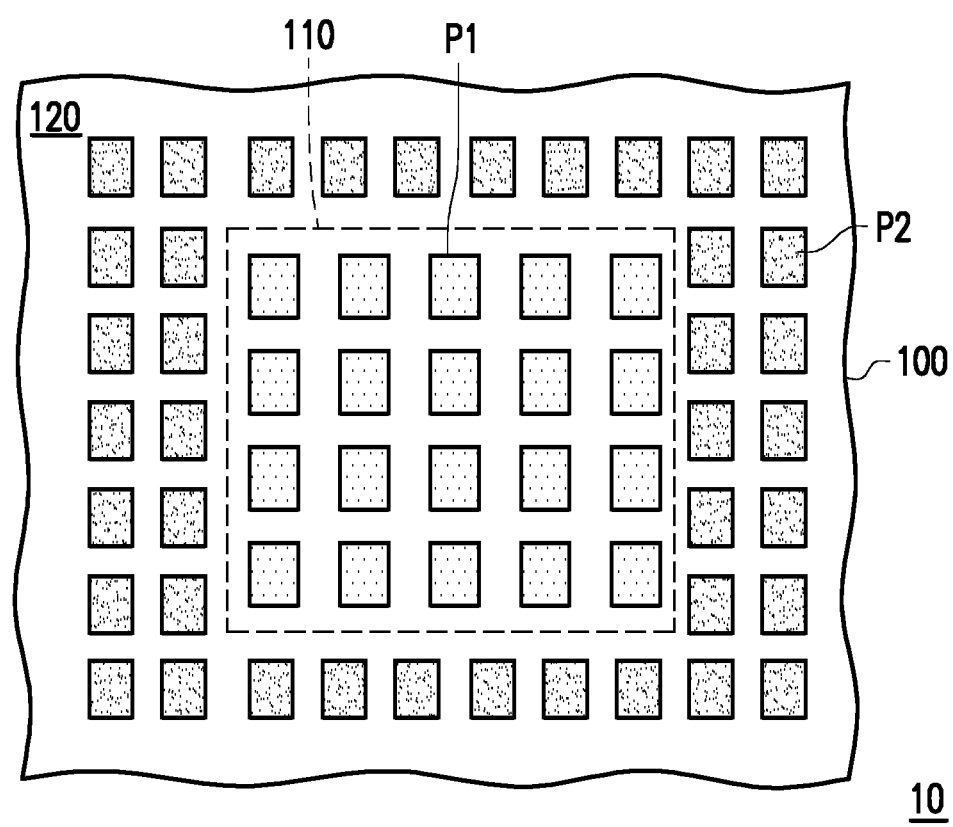
FIG. 1B is a partial schematic top view of a display panel according to an embodiment of the present invention.
Figure 1C:
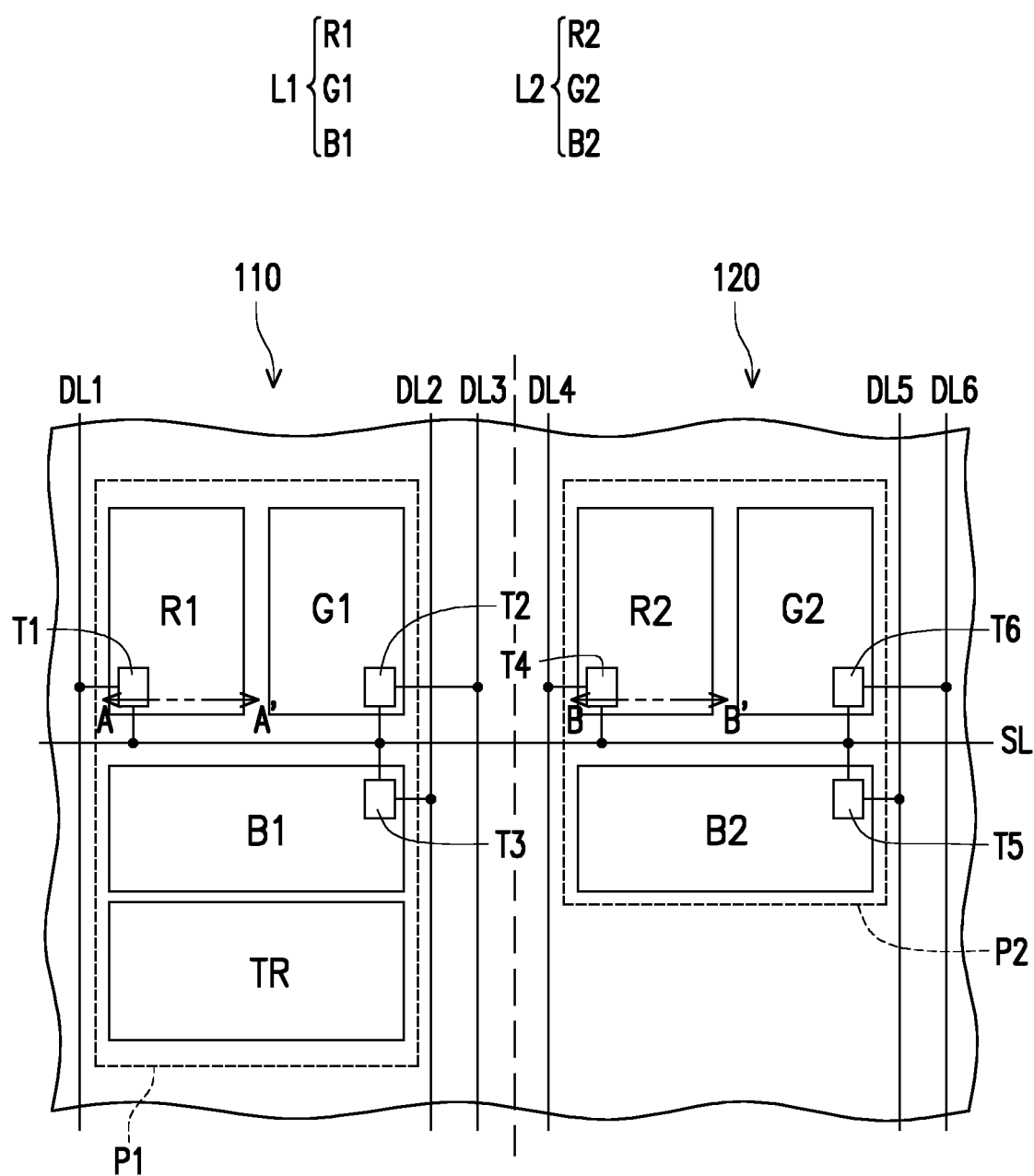
FIG. 1C is a partial schematic top view of a display panel according to an embodiment of the present invention.
Figure 1D:
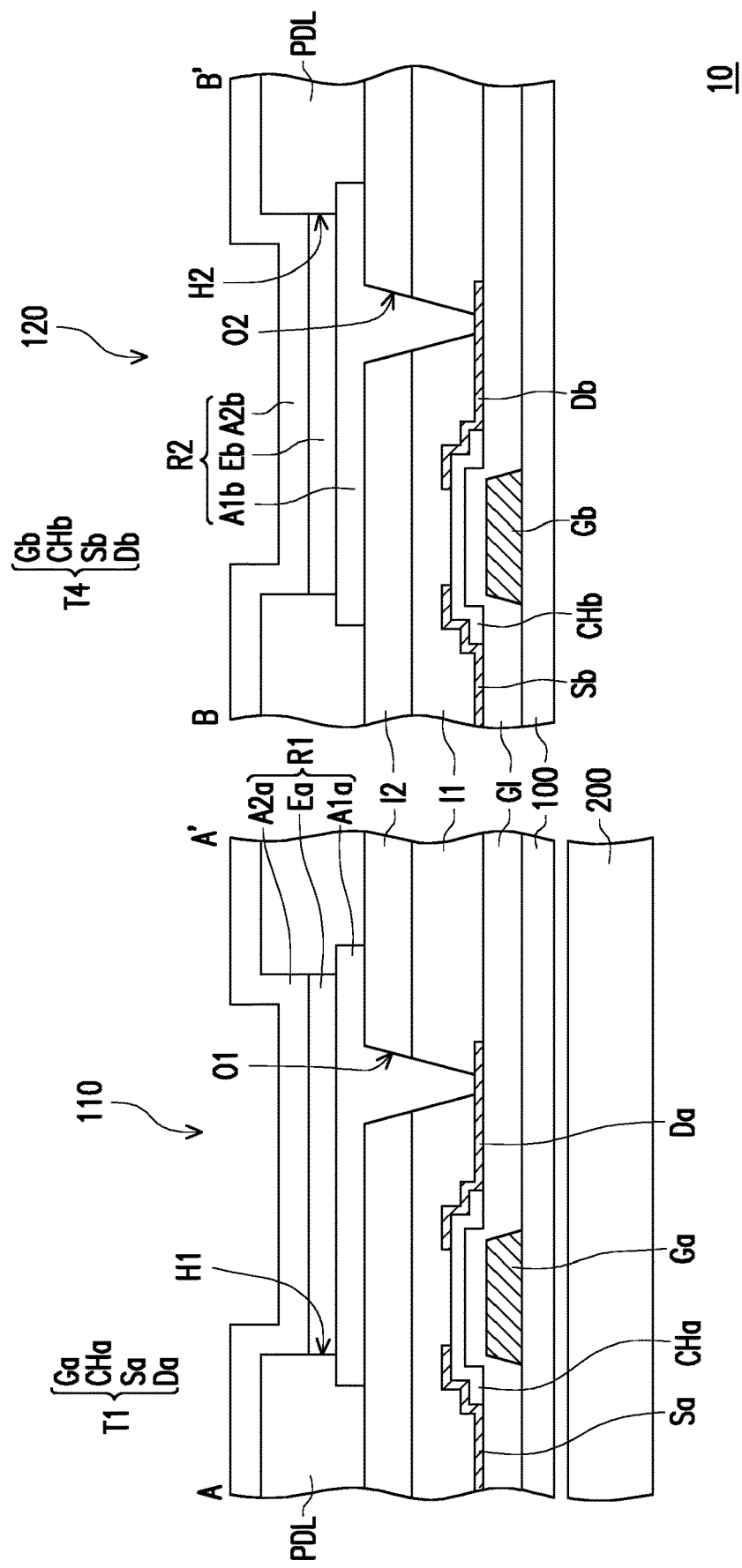
FIG. 1D is a schematic cross-sectional view taken along line AA' and line BB' of FIG. 1C.

FIG. 1B is a partial schematic top view of a display panel according to an embodiment of the present invention. FIG. 1C is a partial schematic top view of a display panel according to an embodiment of the present invention. FIG. 1B is a partially enlarged schematic view of the display panel of FIG. 1A near the first display region 110, and FIG. 1C is an enlarged schematic view of the first pixel, the second pixel and their surrounding elements in FIG. 1B. FIG. 1D is a schematic cross-sectional view taken along line AA' and line BB' of FIG. 1C.

Referring to FIG. 1B to FIG. 1D, the display panel 10 includes the substrate 100, a plurality of first pixels P1, and a plurality of second pixels P2. The first pixels P1 are located on the substrate 100 and are located on the first display region 110. The second pixels P2 are located on the substrate 100 and are located on the second display region 120.

In the present embodiment, each of the first pixels P1 includes a first light-emitting region L1 and a transparent region TR. The first light-emitting region L1 includes a first blue light-emitting diode B1, a first green light-emitting diode G1, and a first red light-emitting diode R1. The transparent region TR is, for example, adjacent to the first blue light-emitting diode B1. Each of the second pixels P2 includes a second light-emitting region L2. The second light-emitting region L2 includes a second blue light-emitting diode B2, a second green light-emitting diode G2, and a second red light-emitting diode R2.

In this embodiment, each of the first pixels P1 further includes switching elements T1 to T3. The switching elements T1 to T3 are electrically connected to a scan line SL and electrically connected to data lines DL1 to DL3, respectively. The switching elements T1 to T3 are electrically connected to the first red light-emitting diode R1, the first blue light-emitting diode B1, and the first green light-emitting diode G1, respectively. In the present embodiment, the first blue light-emitting diode B1, the first green light-emitting diode G1, and the first red light-emitting diode R1 are organic light-emitting diodes, but the invention is not limited thereto. In other embodiments, the first blue light-emitting diode B1, the first green light-emitting diode G1, and the first red light-emitting diode R1 are inorganic light-emitting diodes (or micro-light-emitting diodes (µLED)). In the embodiment, the first pixel P1 includes an active organic light-emitting diode, but the invention is not limited thereto. In other embodiments, the first pixel P1 includes a passive organic light-emitting diode.

In this embodiment, each of the second pixels P2 further includes switching elements T4 to T6. The switching elements T4 to T6 are electrically connected to the scan line SL, and are electrically connected to data lines DL4 to DL6, respectively. The switching elements T4 to T6 are electrically connected to the second red light-emitting diode R2, the second blue light-emitting diode B2, and the second green light-emitting diode G2, respectively. In this embodiment, the second blue light-emitting diode B2, the second green light-emitting diode G2, and the second red light-emitting diode R2 are organic light-emitting diodes, but the invention is not limited thereto. In other embodiments, the second blue light-emitting diode B2, the second green light-emitting diode G2, and the second red light-emitting diode R2 are inorganic light-emitting diodes (or micro-light-emitting diodes). In the embodiment, the second pixel P2 includes an active organic light-emitting diode, but the invention is not limited thereto. In other embodiments, the second pixel P2 includes a passive organic light-emitting diode.

The switching elements T1 to T6 have structures similar to each other, and the first blue light-emitting diode B1, the first green light-emitting diode G1, the first red light-emitting diode R1, the second blue light-emitting diode B2, the second green light-emitting diode G2 and the second red light-emitting diode R2 have structures similar to each other.

Referring to FIG. 1D, the switching element T1 includes a channel layer CHa, a gate Ga, a source Sa, and a drain Da. In fact, the gate Ga is electrically connected to the scan line SL (the cross-sectional angle of FIG. 1D cannot show its connection relationship). The gate Ga overlaps the channel layer CHa, and a gate insulating layer GI is interposed between the gate Ga and the channel layer CHa. The source Sa and the drain Da are located on the channel layer CHa and are electrically connected to the channel layer CHa. The source Sa is electrically connected to the data line DL1. The switching element T4 includes a channel layer CHb, a gate Gb, a source Sb, and a drain Db. The gate Gb is electrically connected to the scan line SL. The gate Gb overlaps the channel layer CHb, and the gate insulating layer GI is interposed between the gate Gb and the channel layer CHb. The source Sb and the drain Db are located on the channel layer CHb and are electrically connected to the channel layer CHb. The source Sb is electrically connected to the data line DL4.

In the present embodiment, the switching elements T1 to T6 are exemplified by bottom-gate type thin film transistors, but the invention is not limited thereto. In other embodiments, the switching elements T1~T6 also are top-gate type thin film transistors or other types of thin film transistors. In this embodiment, the switching elements T1 to T6 are exemplified by amorphous silicon thin film transistors, but the invention is not limited thereto. In another embodiment, the switching elements T1 to T6 also are low temperature polysilicon thin film transistors or oxide semiconductor thin film transistors.

The first red light-emitting diode R1 is electrically connected to the switching element T1. The first red light-emitting diode R1 includes a first electrode A1a, a light-emitting layer Ea, and a second electrode A2a. A first insulating layer I1 is located on the gate insulating layer GI, the source Sa, and the drain Da. A second insulating layer I2 is located on the first insulating layer I1. The first electrode A1a is located on the second insulating layer I2, and is electrically connected to the drain Da of the switching element T1 through an opening O1. The opening O1 penetrates through the first insulating layer I1 and the second insulating layer I2. A pixel defining layer PDL is located on the second insulating layer I2 and has an opening H1. The light-emitting layer Ea is located in the opening H1 and electrically connected to the first electrode A1a. The second electrode A2a is located on the pixel defining layer PDL, and is electrically connected to the light-emitting layer Ea.

The second red light-emitting diode R2 is electrically connected to the switching element T4. The second red light-emitting diode R2 includes a first electrode A1b, a light-emitting layer Eb, and a second electrode A2b. The first insulating layer I1 is located on the gate insulating layer GI, the source Sb, and the drain Db. The first electrode A1b is located on the second insulating layer I2, and is electrically connected to the drain Db of the switching element T4 through an opening O2. The opening O2 penetrates through the first insulating layer I1 and the second insulating layer I2. The pixel defining layer PDL has an opening H2. The light-emitting layer Eb is located in the opening H2 and electrically connected to the first electrode A1b. The second electrode A2b is located on the pixel defining layer PDL and electrically connected to the light-emitting layer Eb.

In this embodiment, the area of the first light-emitting region L1 is approximately equal to the total light-emitting area of the light-emitting layer of the first blue light-emitting diode B1, the light-emitting layer of the first green light-emitting diode G1, and the light-emitting layer of the first red light-emitting diode R1. It can also be said that the area of the first light-emitting region L1 is defined by the pixel definition layer PDL. In this embodiment, the area of the second light-emitting area L2 is approximately equal to the total light-emitting area of the light-emitting layer of the second blue light-emitting diode B2, the light-emitting layer of the second green light-emitting diode G2, and the light-emitting layer of the second red light-emitting diode R2. It can also be said that the area of the second light-emitting area L2 is defined by the pixel definition layer PDL.

Adjusting the area of the first light-emitting region L1, the area of the transparent region TR, and the area of the second light-emitting area L2 can make the first pixel P1 and the second pixel P2 have different transmittances.

In the present embodiment, the area of the second light-emitting area L2 is approximately equal to the area of the first light-emitting region L1, and the first pixel P1 includes the transparent region TR in addition to the first light-emitting region L1. In other words, the area of the first pixel P1 is larger than the area of the second pixel P2. In this embodiment, the light-emitting area of the first blue light-emitting diode B1 is substantially equal to the light-emitting area of the second blue light-emitting diode B2, the light-emitting area of the first green light-emitting diode G1 is substantially equal to the light-emitting area of the second green light-emitting area G2, and the light-emitting area of the first red light-emitting diode R1 is substantially equal to the light-emitting area of the second red light-emitting diode R2, but the invention is not limited thereto.

In this embodiment, the area of the first pixel P1 or the area of the second pixel P2 is approximately equal to the area surrounded by the corresponding two scan lines and the corresponding two data lines, but the invention is not limited thereto. In some embodiments, the area of the first pixel P1 or the area of the second pixel P2 is defined by the pixel definition layer PDL.

The transparent region TR is a region in the first pixel P1 having a larger transmittance than the first light-emitting region L1, and its area is defined, for example, by the second electrode. For example, the second electrodes of the light-emitting diodes are integrally connected to each other, and the integrated second electrode has an opening at the transparent region TR, so that the transparent region TR has a higher transmittance. In other embodiments, not only the second electrode is not disposed at the transparent region TR, but also other layers, such as the light-emitting layer, the first electrode, or the insulating layers, are not disposed. In other words, the layers of the light-emitting layer, the first electrode, the insulating layers, and the like also have openings at the transparent region TR, so that the transparent region TR has a higher transmittance. In this embodiment, the area of the transparent region TR is regarded as the area of the opening of the second electrode, but the invention is not limited thereto. In another embodiment, the area of the transparent region TR also is defined by the pixel definition layer PDL.

In the embodiment, the display panel 10 further includes an optical module 200, and the optical module 200 is disposed at a position corresponding to the first display region 110. The first display region 110 also is referred to as an imaging region, and light passes through the first display region 110 to reach the optical module 200. The optical module 200 is, for example, a CMOS sensor, a photo sensor, a charge-coupled device, a 3D sensor, or an iris recognition device.

In some embodiments, the transparent region TR occupies about ⅓ to ⅔ of the area of the first pixel P1, and the first light-emitting region L1 occupies about ⅓ to ⅔ of the area of the first pixel P1. The ratio of the transmittance of the second pixels P2 to the transmittance of the first pixels P1 is 0.33 to 0.66. For example, the ratio of the transmittance of each of the second pixels P2 (or the average transmittance of the second display region 120) to the transmittance of each of the first pixels P1 (or the average transmittance of the first display region 110) is 0.33 to 0.66.

When the ratio of the transmittance of the second pixels P2 to the transmittance of the first pixels P1 is less than 0.33, the transmittance of the first pixels P1 is too high which results in poor image quality of the first display region 110. For example, when the transmittance of the first pixels P1 or the proportion of the area of the transparent region increases, the image clarity will decrease. Once the difference in transmittance between the first pixels P1 and the second pixels P2 becomes larger, the image resolution between the first display region 110 and the second display region 120 also is different, and even affect the visual comfort of the viewer and the image quality of the display panel 10. In addition, when the ratio of the transmittance of the second pixels P2 to the transmittance of the first pixels P1 is greater than 0.66, the transmittance of the first pixels P1 is too low, which causes the amount of received light of the optical module 200 being insufficient. Therefore, in the embodiment, when the ratio of the transmittance of the second pixels P2 to the transmittance of the first pixels P1 is between 0.33 and 0.66, good display quality of the display panel 10 can be ensured, and good performance of the optical module 200 corresponding to the first display region 110 can also be ensured. As a whole, the average transmittance ratio of the second display region 120 to the first display region 110 is between 0.33 and 0.66, so that the display panel 10 can have good display quality and good performance of the optical module 200.

Specifically, since the transmittance of the first pixels P1 is higher than the transmittance of the second pixels P2, when the photographing function is to be performed, the image can pass through the first pixels P1 and reach the optical module 200. Further, the first pixels P1 have displaying function. For example, the first pixels P1 on the first display region 110 display an icon (Icon) such as a battery power, a network signal or other images. In other words, the first pixels P1 can maintain functions such as photography and sensing while achieving the display function.

Based on the above, since the display panel 10 includes the first pixels P1 and the second pixels P2 having different transmittances, the area of the region capable of displaying images of the display panel 10 can be increased, thereby obtaining the advantage of a narrow border or borderless. In this way, the display panel 10 of the embodiment can realize the displaying function of the full screen.

In some embodiments, the first pixels P1 and the second pixels P2 have the same brightness. Different colors of the light-emitting diodes have different aging conditions. When the aging problem occurs, the said problem can be compensated by using the algorithm or circuit, thereby the display quality is avoided from being affected by the lifetime of the light-emitting diodes.

Figure 2A:
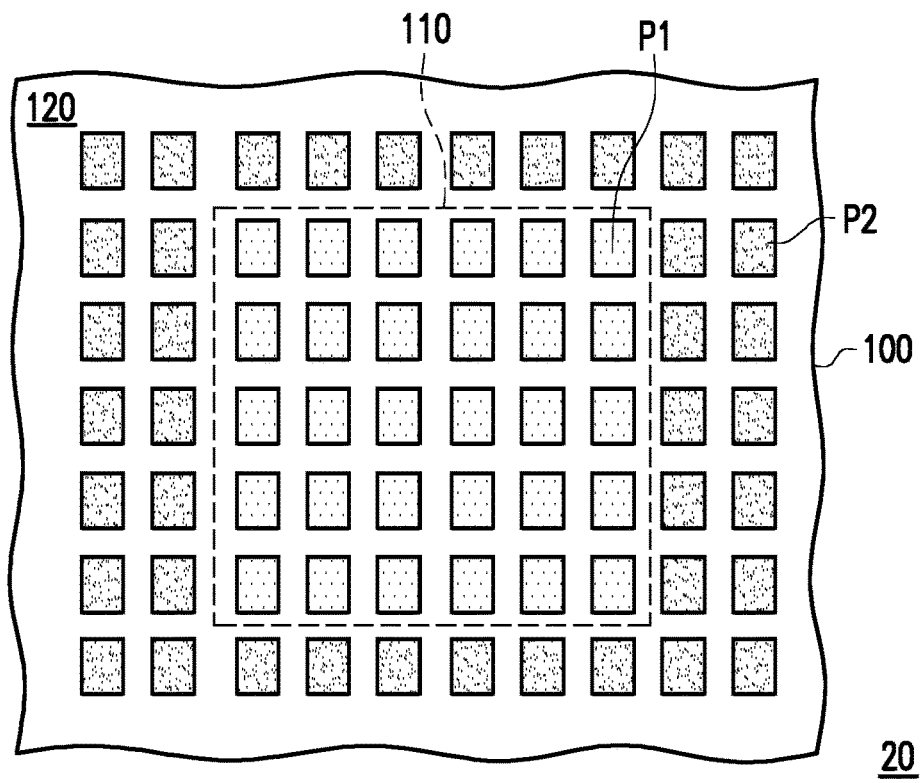
FIG. 2A is a partial schematic top view of a display panel according to an embodiment of the present invention.
Figure 2B:
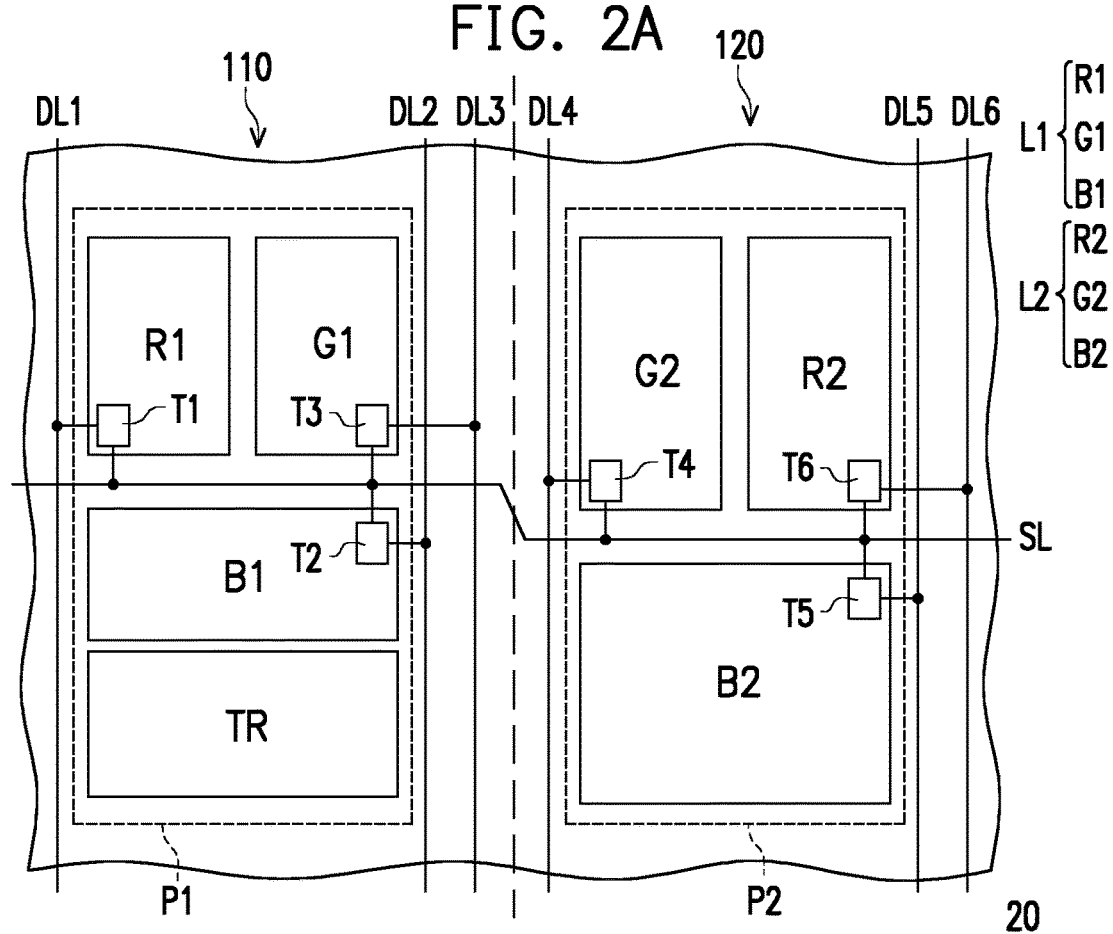
FIG. 2B is a partial schematic top view of a display panel according to an embodiment of the present invention.

FIG. 2A is a partial schematic top view of a display panel according to an embodiment of the present invention. FIG. 2B is a partial schematic top view of a display panel according to an embodiment of the present invention. FIG. 2B is an enlarged schematic view of the first pixel, the second pixel, and their surrounding elements in FIG. 2A. It is to be noted that reference numerals and a part of contents of the embodiment of FIG. 1A to FIG. 1D are adopted in the embodiment of FIG. 2A and FIG. 2B, wherein the same or similar elements are represented by the same or similar reference numerals, and descriptions of the same technical contents are omitted. The aforementioned embodiment may be referred for descriptions of the omitted parts, and detailed descriptions thereof are not repeated in the following embodiment.

Referring to FIG. 2A and FIG. 2B, in a display panel 20, the area of the first pixel P1 is approximately equal to the area of the second pixel P2.

In this embodiment, the area of the second light-emitting area L2 is larger than the area of the first light-emitting region L1. In this embodiment, the light-emitting area of the second blue light-emitting diode B2 is larger than the light-emitting area of the first blue light-emitting diode B1, the light-emitting area of the second green light-emitting diode G2 is larger than the light-emitting area of the first green light-emitting diode G1, and the light-emitting area of the second red light-emitting diode R2 is larger than the light-emitting area of the first red light-emitting diode R1, but the invention is not limited thereto.

In some embodiments, the transparent region TR occupies about ⅓ to ⅔ of the area of the first pixel P1, and the first light-emitting region L1 occupies about ⅓ to ⅔ of the area of the first pixel P1. The ratio of the transmittance of the second pixels P2 to the transmittance of the first pixels P1 is 0.33 to 0.66. Thereby, the display panel 20 can have the advantages of good image quality and good amount of received light of the optical module 20.

Based on the above, since the display panel 20 includes the first pixels P1 and the second pixels P2 having different transmittances, the area of the region capable of displaying images of the display panel 20 can be increased, whereby the image quality of the display panel 20 can be improved, and the advantage of a narrow border or borderless can be obtained.

Figure 3:
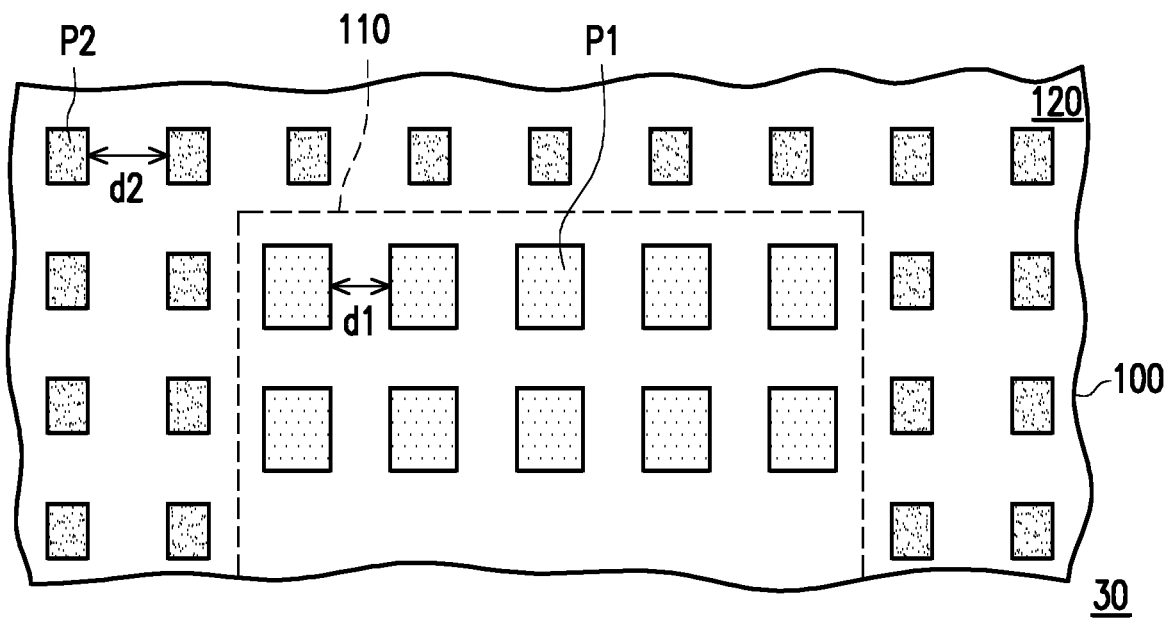
FIG. 3 is a partial schematic top view of a display panel according to an embodiment of the present invention.

FIG. 3 is a partial schematic top view of a display panel according to an embodiment of the present invention. It should be noted that reference numerals and a part of contents of the embodiment of FIG. 1A to FIG. 1D are adopted in the embodiment of FIG. 3, wherein the same or similar elements are represented by the same or similar reference numerals, and descriptions of the same technical contents are omitted. The aforementioned embodiment may be referred for descriptions of the omitted parts, and detailed descriptions thereof are not repeated in the following embodiment.

Referring to FIG. 3, in a display panel 30, in order to make the difference of the resolution between the first display region 110 and the second display region 120 small, the spacing d1 between two adjacent first pixels P1 is smaller than the spacing d2 between two adjacent second pixels P2. More specifically, since the area of each first pixel P1 is larger than the area of each second pixel P2, if the resolution of the first display region 110 and the resolution of the second display region 120 are to be the same, the spacing d1 is smaller than the spacing d2.

In some embodiments, the ratio of the spacing d1 between two adjacent first pixels P1 to the spacing d2 between two adjacent second pixels P2 is 0.33 to 0.66.

Based on the above, since the display panel 30 includes the first pixels P1 and the second pixels P2, the display device 30 has a higher transmittance and the area of the region capable of displaying images of the display panel 30 can be increased, whereby the image quality of the display panel 30 can be improved and the advantage of a narrow border or borderless can be obtained.

Figure 4:
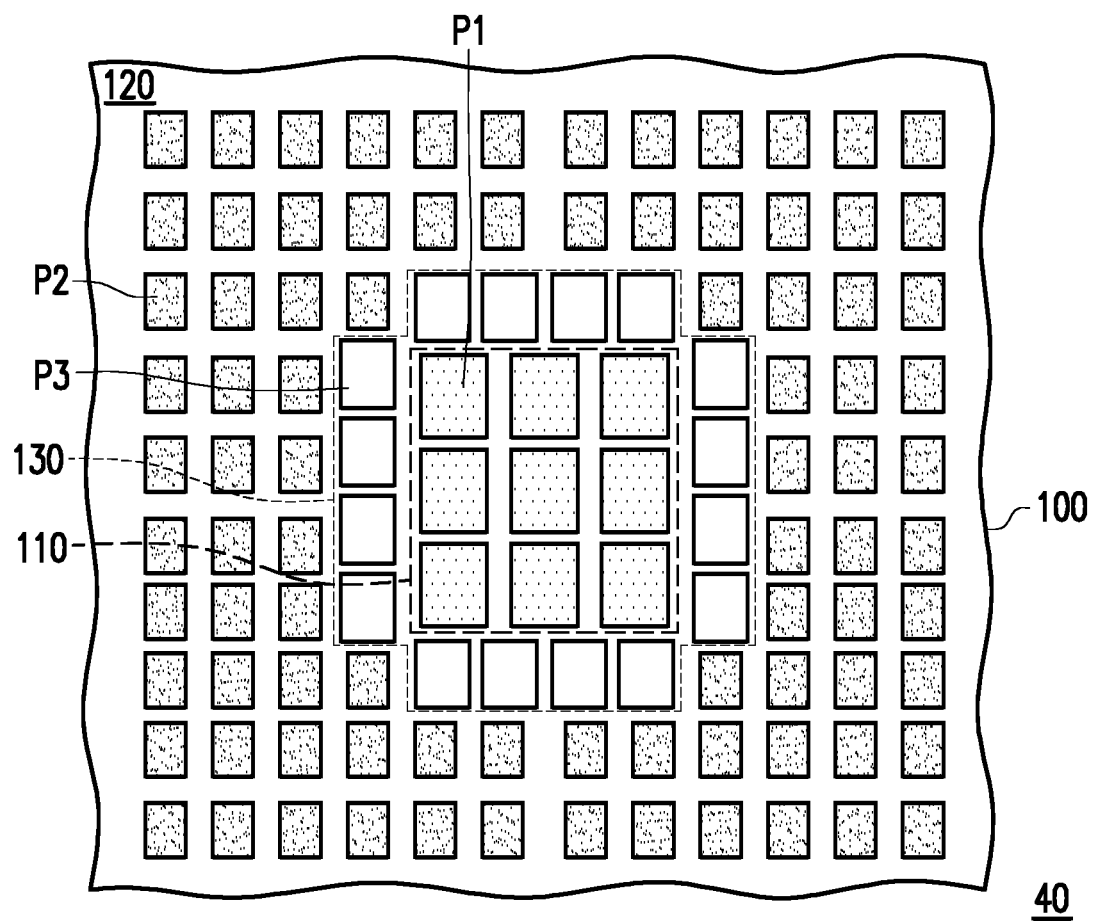
FIG. 4 is a partial schematic top view of a display panel in accordance with an embodiment of the present invention.

FIG. 4 is a partial schematic top view of a display panel in accordance with an embodiment of the present invention. It should be noted that reference numerals and a part of contents of the embodiment of FIG. 1A to FIG. 1D are adopted in the embodiment of FIG. 4, wherein the same or similar elements are represented by the same or similar reference numerals, and descriptions of the same technical contents are omitted. The aforementioned embodiment may be referred for descriptions of the omitted parts, and detailed descriptions thereof are not repeated in the following embodiment.

Referring to FIG. 4, in a display panel 40, the substrate 100 has a third region 130. The third region 130 is located between the first display region 110 and the second display region 120. The display panel 40 further includes a plurality of third pixels P3. The third pixels P3 are located on the third region 130.

The transmittance of the third pixels P3 is between the transmittance of the first pixels P1 and the transmittance of the second pixels P2. In some embodiments, the transmittance of the third pixels P3 can be controlled by adjusting the areas of the transparent regions. For example, the area of the transparent region of each third pixel P3 is smaller than the area of the transparent region of each first pixel P1. In the present embodiment, the area of the third pixel P3 is between the area of the first pixel P1 and the area of the second pixel P2.

By setting the third pixels P3 can make the image generated by the display panel 40 relatively continuous, thereby preventing obvious lines from being generated between images produced by different pixels.

In summary, in the present invention, since the display panel includes the first pixels and the second pixels having different transmittances, the area of the region capable of displaying images of the display panel can be increased, thereby the image quality of the display panel can be improved and the advantage of a narrow border or borderless can be obtained.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A display panel comprising:
   a substrate having a first display region and a second display region;
   a plurality of first pixels located on the first display region, wherein the plurality of first pixels are configured to emit red light, blue light, green light, or combination thereof; and
   a plurality of second pixels are located on the second display region, wherein the plurality of second pixels are configured to emit red light, blue light, green light, or combination thereof, wherein a ratio of a transmittance of the second pixels to a transmittance of the first pixels is 0.33 to 0.66, wherein the first pixels are arranged along a first direction and a second direction perpendicular with the first direction, each of spacings between each of adjacent ones of the first pixels in the first direction is less than each of spacings between each of adjacent ones of the second pixels in the first direction, and each of spacings between each of adjacent ones of the first pixels in the second direction is less than each of spacings between each of adjacent ones of the second pixels in the second direction.

2. The display panel of claim 1, wherein the substrate has a third display region between the first display region and the second display region, and the display panel further comprises:
   a plurality of third pixels located on the third display region, wherein a transmittance of the third pixels is between the transmittance of the first pixels and the transmittance of the second pixels.

3. The display panel of claim 2, wherein an area of each of the third pixels is between an area of each of the first pixels and an area of each of the second pixels.

4. The display panel of claim 1, wherein the first pixels and the second pixels have the same brightness.

5. The display panel of claim 1, wherein an area of each of the first pixels is larger than an area of each of the second pixels.

6. The display panel of claim 5, wherein each of the first pixels comprises a first light-emitting area and a transparent region, and the transparent region occupies ⅓ to ⅔ of the area of the first pixel.

7. The display panel of claim 6, wherein each of the second pixels comprises a second light-emitting region, an area of the second light-emitting region is equal to an area of the first light-emitting region.

8. The display panel of claim 1, wherein each of the first pixels comprises a first light-emitting region and a transparent region, and the transparent region occupies ⅓ to ⅔ of an area of the first pixel.

9. The display panel of claim 8, wherein each of the second pixels comprises a second light-emitting area, an area of the second light-emitting area is greater than an area of the first light-emitting area.

10. The display panel of claim 1, wherein a ratio each of spacings between each of adjacent ones of the first pixels in the first direction to each of spacings between each of adjacent ones of the second pixels in the first direction is 0.33 to 0.66.

11. The display panel of claim 1, wherein each of the first pixels comprises a first light-emitting region and a transparent region, the first light-emitting region comprises a first blue light-emitting diode, a first green light-emitting diode and a first red light-emitting diode, wherein in each of the first pixels, the transparent region is adjacent to the first blue light-emitting diode.

12. The display panel of claim 1, further comprising:
an optical module, disposed at a position corresponding to the first display region.

13. A display panel comprising:
a substrate having a first display region and a second display region;
a plurality of first pixels located on the first display region, wherein each of the plurality of first pixels includes a first blue light-emitting diode, a first green light-emitting diode, and a first red light-emitting diode; and
a plurality of second pixels are located on the second display region, wherein each of the plurality of second pixels includes a second blue light-emitting diode, a second green light-emitting diode, and a second red light-emitting diode, wherein a ratio of a transmittance of the second pixels to a transmittance of the first pixels is 0.33 to 0.66, wherein the first pixels are arranged along a first direction and a second direction perpendicular with the first direction, each of spacings between each of adjacent ones of the first pixels in the first direction is less than each of spacings between each of adjacent ones of the second pixels in the first direction, and each of spacings between each of adjacent ones of the first pixels in the second direction is less than each of spacings between each of adjacent ones of the second pixels in the second direction.

14. A display panel comprising:
a substrate having a first display region and a second display region;
a plurality of first pixels located on the first display region, wherein each of the plurality of first pixels includes first switching elements and first light-emitting diodes, and the first switching elements and the first light-emitting diodes are electrically connected; and
a plurality of second pixels are located on the second display region, wherein each of the plurality of second pixels includes second switching elements and second light-emitting diodes, and the second switching elements and the second light-emitting diodes are electrically connected, wherein a ratio of a transmittance of the second pixels to a transmittance of the first pixels is 0.33 to 0.66, wherein the first pixels are arranged along a first direction and a second direction perpendicular with the first direction, each of spacings between each of adjacent ones of the first pixels in the first direction is less than each of spacings between each of adjacent ones of the second pixels in the first direction, and each of spacings between each of adjacent ones of the first pixels in the second direction is less than each of spacings between each of adjacent ones of the second pixels in the second direction.

* * * * *